(12) United States Patent
Lee et al.

(10) Patent No.: US 8,902,633 B2
(45) Date of Patent: Dec. 2, 2014

(54) RESISTIVE MEMORY DEVICE COMPRISING SELECTIVELY DISABLED WRITE DRIVER

(71) Applicant: Samsung Electronics Co., Ltd., Suwon-si (KR)

(72) Inventors: Sung-Yeon Lee, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/798,374

(22) Filed: Mar. 13, 2013

(65) Prior Publication Data
US 2014/0211538 A1     Jul. 31, 2014

(30) Foreign Application Priority Data

Jan. 29, 2013     (KR) .................. 10-2013-0009956

(51) Int. Cl.
| | | |
|---|---|---|
| *G11C 11/00* | (2006.01) | |
| *G11C 13/00* | (2006.01) | |
| *G11C 16/34* | (2006.01) | |
| *G11C 7/10* | (2006.01) | |

(52) U.S. Cl.
CPC ........ *G11C 13/0069* (2013.01); *G11C 13/0064* (2013.01); *G11C 7/1006* (2013.01); *G11C 16/3454* (2013.01)
USPC .................. 365/148; 365/185.22; 365/189.16

(58) Field of Classification Search
CPC ........... G11C 13/0069; G11C 13/0064; G11C 7/1006; G11C 7/1078; G11C 11/5628; H01L 27/10805; H01L 27/1052; H01L 27/115; H01L 27/11524; H01L 27/11521; H01L 27/1023; H01L 29/7926; H01L 43/08
USPC .......... 365/148, 100, 185.18, 185.22, 189.07, 365/189.16
See application file for complete search history.

(56) References Cited

U.S. PATENT DOCUMENTS

| | | | |
|---|---|---|---|
| 6,839,282 B2 | 1/2005 | Aoki | |
| 7,764,542 B2 | 7/2010 | Edahiro et al. | |
| 8,116,117 B2 | 2/2012 | Cho et al. | |
| 8,432,734 B2 * | 4/2013 | Kim | .......................... 365/185.03 |
| 2007/0140017 A1 | 6/2007 | Kaneko et al. | |
| 2008/0068903 A1 * | 3/2008 | Park et al. ................ | 365/189.16 |
| 2009/0129157 A1 | 5/2009 | Honda et al. | |
| 2009/0161421 A1 * | 6/2009 | Cho et al. ...................... | 365/163 |
| 2010/0027326 A1 * | 2/2010 | Kim et al. ..................... | 365/163 |
| 2011/0085379 A1 * | 4/2011 | Kim ......................... | 365/185.03 |
| 2012/0069672 A1 | 3/2012 | Shiino et al. | |
| 2014/0112052 A1 * | 4/2014 | Strand et al. .................. | 365/148 |
| 2014/0204650 A1 * | 7/2014 | Lee et al. ...................... | 365/148 |

* cited by examiner

*Primary Examiner* — Gene Auduong
(74) *Attorney, Agent, or Firm* — Volentine & Whitt, PLLC

(57) ABSTRACT

A nonvolatile memory device comprises a resistive memory cell, a write driver configured to write data to the resistive memory cell during a write period comprising a plurality of loops, and a sense amplifier configured to verify whether the data is correctly written to the resistive memory cell in each of the loops. Where the sense amplifier verifies that the data is correctly written in a k-th loop among the loops, the write driver is disabled from a (k+1)-th loop to an end of the write period.

20 Claims, 21 Drawing Sheets

Fig. 1

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

UNIDIRECTIONAL WRITE

UNIDIRECTIONAL WRITE

Fig. 16
SELECTIVE BIDIRECTIONAL WRITE
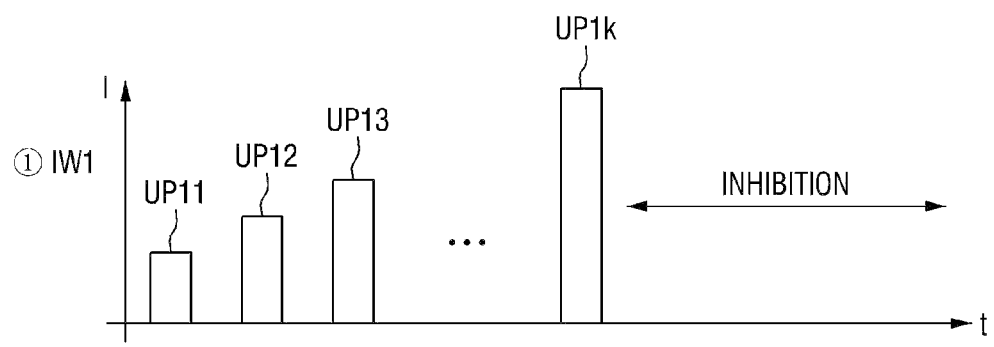
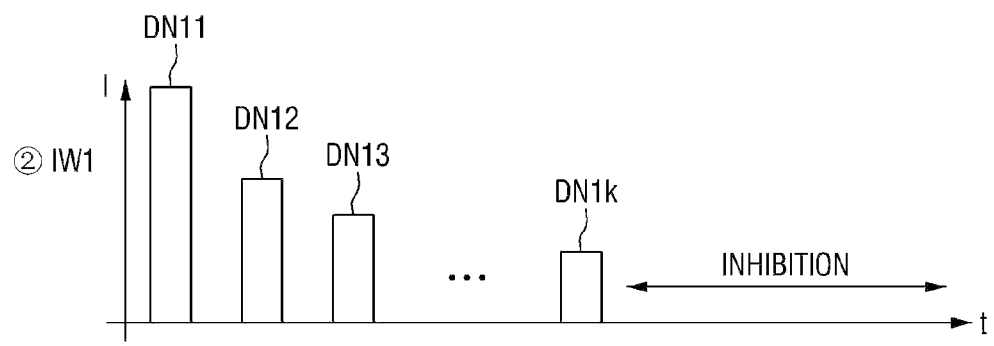

RESISTIVE MEMORY DEVICE COMPRISING SELECTIVELY DISABLED WRITE DRIVER

CROSS-REFERENCE TO RELATED APPLICATIONS

This application claims priority under 35 U.S.C. §119 to Korean Patent Application No. 10-2013-0009956 filed on Jan. 29, 2013, the subject matter of which is hereby incorporated by reference.

BACKGROUND OF THE INVENTION

The inventive concept relates generally to electronic memory technologies. More particularly, certain embodiments of the inventive concept relate to a nonvolatile memory device comprising a resistive memory cell and a selectively disabled write driver.

Nonvolatile memory devices are widely used to provide long term data storage. They can be found in a broad range of consumer and industrial electronic devices, such as computers, mobile phones, cameras, and portable memory devices, to name but a few. In an effort to improve various aspects of nonvolatile memory devices, such as cost, storage capacity, and performance, researchers continue to investigate new ways of forming and operating the nonvolatile memory devices.

One class of nonvolatile memory devices uses variable resistance materials to store data. Such devices can be referred to as resistive memory devices. Examples of resistive memory devices include phase-change random access memories (PRAMs), resistive RAMs (RRAMs), and magnetic RAMs (MRAMs). Some of these devices store data using a state change of a phase-change material such as chalcogenide alloy (e.g., PRAMs), a resistance change of a variable resistance material (e.g., RRAMs), or a resistance change of a magnetic tunnel junction (MTJ) thin film according to a magnetization state of a ferromagnetic material (e.g., MRAMs). The phase-change material of a PRAM assumes a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

In an effort to improve these and other forms of resistive memory devices, researchers are engaged in continuing efforts to develop better designs and operating techniques for the devices.

SUMMARY OF THE INVENTION

In one embodiment of the inventive concept, a nonvolatile memory device comprises a resistive memory cell, a write driver configured to write data to the resistive memory cell during a write period comprising a plurality of loops, and a sense amplifier configured to verify whether the data is correctly written to the resistive memory cell in each of the loops. Where the sense amplifier verifies that the data is correctly written in a k-th loop among the loops, the write driver is disabled from a (k+1)-th loop to an end of the write period.

In another embodiment of the inventive concept, a nonvolatile memory device comprises first through n-th resistive memory cells, and first through n-th write/verify units corresponding to the first through n-th resistive memory cells, respectively. An m-th write/verify unit (1≤m≤n) comprises an m-th write driver, an m-th sense amplifier and an m-th enable latch, wherein the m-th write driver executes a write operation during a write period in response to a corresponding write enable signal, the m-th sense amplifier verifies whether the write operation was executed correctly, and the m-th enable latch provides the corresponding write enable signal, wherein where the m-th sense amplifier determines that the write operation is executed correctly, the m-th enable latch disables the m-th write driver until the write period ends by transitioning the corresponding write enable signal.

In yet another embodiment of the inventive concept, a method of operating a nonvolatile memory device comprising a resistive memory cell, a write driver, and a sense amplifier. The method comprises operating the write driver to write data to the resistive memory cell during a write period comprising a plurality of loops, operating the sense amplifier to verify whether the data is correctly written to the resistive memory cell in each of the loops, and upon verifying that the data is correctly written in a k-th loop among the loops, disabling the write driver from a (k+1)-th loop to an end of the write period.

BRIEF DESCRIPTION OF THE DRAWINGS

The drawings illustrate selected embodiments of the inventive concept. In the drawings, like reference numbers indicate like features.

FIG. 1 is a layout diagram of a nonvolatile memory device according to an embodiment of the inventive concept.

FIG. 16 is another diagram illustrating a method of operating a nonvolatile memory device according to still another embodiment of the inventive concept.

DETAILED DESCRIPTION

Figure 2:
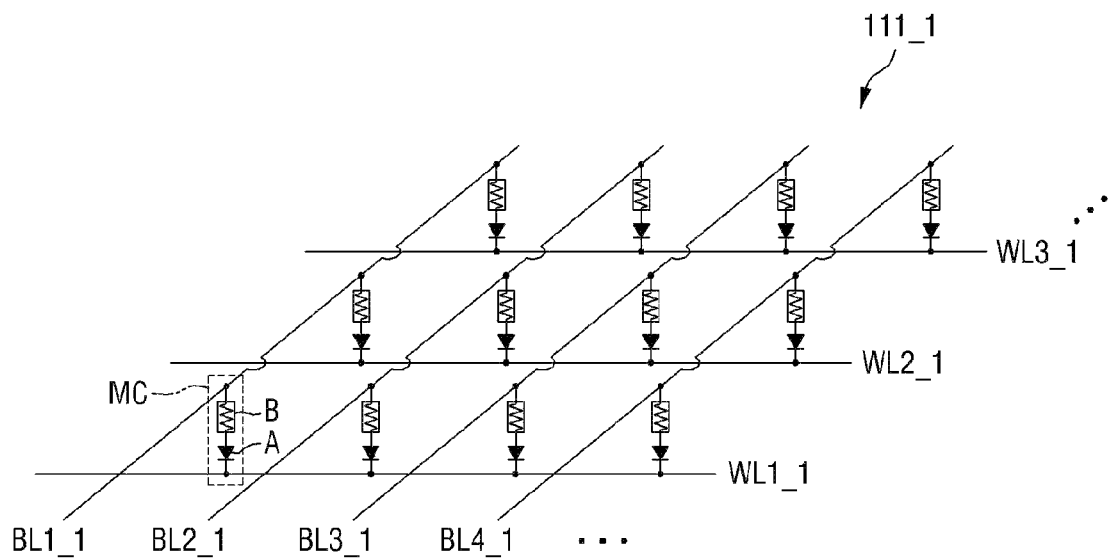
FIG. 2 is a diagram illustrating an example configuration of the memory cell array of FIG. 1.

Embodiments of the inventive concept are described below with reference to the accompanying drawings. These embodiments are presented as teaching examples and should not be construed to limit the scope of the inventive concept.

In the description that follows, the terms first, second, etc. may be used to describe various elements, components, regions, layers and/or sections, but these elements, components, regions, layers and/or sections should not be limited by these terms. Rather these terms are used merely to distinguish one element, component, region, layer or section from another element, component, region, layer or section. Thus, a first element, component, region, layer or section discussed below could be termed a second element, component, region, layer or section without departing from the teachings of the inventive concept.

The terminology used herein is for the purpose of describing particular embodiments only and is not intended to limit the inventive concept. As used herein, the singular forms "a," "an" and "the" are intended to include the plural forms as well, unless the context clearly indicates otherwise. The terms "comprises," "comprising," "includes" and/or "comprising," where used in this specification, indicate the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein.

FIG. 1 is a layout diagram of a nonvolatile memory device according to an embodiment of the inventive concept. In the illustrated embodiment, the nonvolatile memory device comprises sixteen memory banks, although the inventive concept is not limited to this example.

Referring to FIG. 1, the nonvolatile memory device comprises a memory cell array, a plurality of sense amplifier (sense amp)/write drivers 2_1 through 2_8, and a peripheral circuit region 3.

The memory cell array comprises a plurality of memory banks 1_1 through 1_16, and each of memory banks 1_1 through 1_16 comprises a plurality of memory blocks BLK0 through BLK7. Each of memory blocks BLK0 through BLK7 comprises a plurality of nonvolatile memory cells arranged in a matrix. In the illustrated embodiment, each of memory banks 1_1 through 1_16 comprises eight memory blocks, although the inventive concept is not limited to this configuration.

Although not shown in the FIG. 1, a row select circuit and a column select circuit are placed to correspond to each of memory banks 1_1 through 1_16. The row select circuit and the column select circuit respectively designate a row and a column of resistive memory cells to be written and read.

Each of sense amp/write drivers 2_1 through 2_8 is placed to correspond to two of memory banks 1_1 through 1_16 and executes read and write operations on the two corresponding memory banks. In the illustrated embodiment, each of the sense amp/write drivers 2_1 through 2_8 corresponds to two of memory banks 1_1 through 1_16, although the inventive concept is not limited to this configuration. Alternatively, for instance, each of sense amp/write drivers 2_1 through 2_8 could correspond to one memory bank or four memory banks.

Peripheral circuit region 3 comprises a plurality of logic circuit blocks and a voltage generator to operate the column select circuit, the row select circuit, and sense amp/write drivers 2_1 through 2_8.

Figure 3:
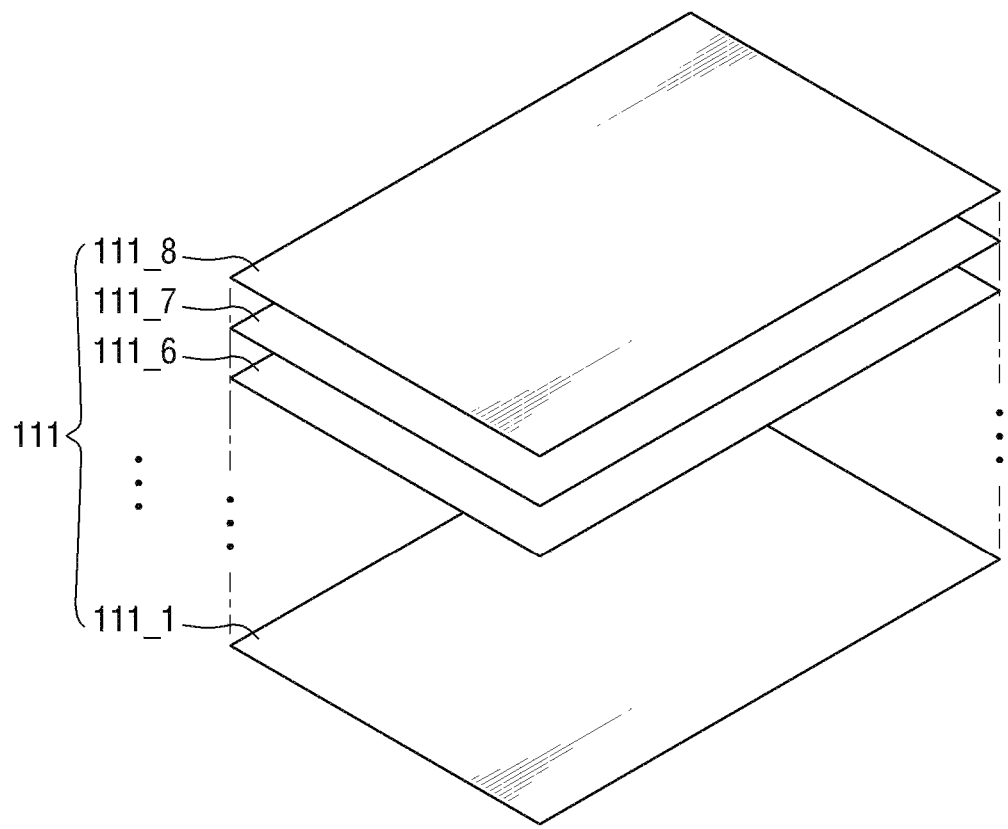
FIG. 3 is a diagram illustrating another example configuration of the memory cell array of FIG. 1.

FIGS. 2 and 3 are diagrams illustrating example configurations of the memory cell array of FIG. 1.

Referring to FIG. 2, in a first configuration memory cell array has a cross point structure. In the cross point structure, one memory cell is formed in a region in which one line crosses another line. For example, bit lines BL1_1 through BL4_1 may extend in a first direction, and word lines WL1_1 through WL3_1 may extend in a second direction to cross bit lines BL1_1 through BL4_1. A resistive memory cell MC is formed in a region in which each of bit lines BL1_1 through BL4_1 crosses each of word lines WL1_1 through WL3_1.

A resistive memory cell MC to be read is selected from a plurality of resistive memory cells MC in the memory cell array. Where the resistive memory cell MC is a PRAM cell, it comprises a variable resistive element B containing a phase-change material and an access element A that controls an electric current flowing through the variable resistive element B. Here, access element A may be a diode or transistor connected in series to the variable resistive element B. In addition, examples of the phase-change material include various combinations of two elements such as GaSb, InSb, InSe, $Sb_2Te_3$ or GeTe, combinations of three elements such as GeSbTe, GaSeTe, InSbTe, $SnSb_2Te_4$ or InSbGe, and combinations of four elements such as AgInSbTe, (GeSn) SbTe, GeSb (SeTe) or $Te_{81}Ge_{15}Sb_2S_2$. Among these combinations, GeSbTe, which contains germanium (Ge), antimony (Sb), and tellurium (Te), is commonly used as the phase-change material in PRAM devices.

Where the resistive memory cell MC is a resistive random access memory (RRAM), the variable resistive element B may include, for example, NiO or perovskite. The perovskite may be a composition such as manganite ($Pr_{0.7}Ca_{0.3}MnO_3$, $Pr_{0.5}Ca_{0.5}MnO_3$, other PCMO, LCMO, etc), titanate (STO: Cr), or zirconate (SZO:Cr, $Ca_2Nb_2O_7$:Cr, $Ta_2O_5$:Cr).

Alternatively, the memory cell array may have a 3D stacked structure as shown in FIG. 3. The 3D stacked structure comprises a vertical stack of memory cell layers 111_1 through 111_8. FIG. 3 shows an example where eight memory cell layers 111_1 through 111_8 are stacked. However, the inventive concept is not limited to this example. Each of memory cell layers 111_1 through 111_8 may comprise a plurality of memory cell groups and/or a plurality of redundancy memory cell groups. Where the memory cell array has the 3D stacked structure, each of memory cell layers 111_1 through 111_8 may have the cross point structure of FIG. 2, although the inventive concept is not limited to this configuration.

Figure 4:
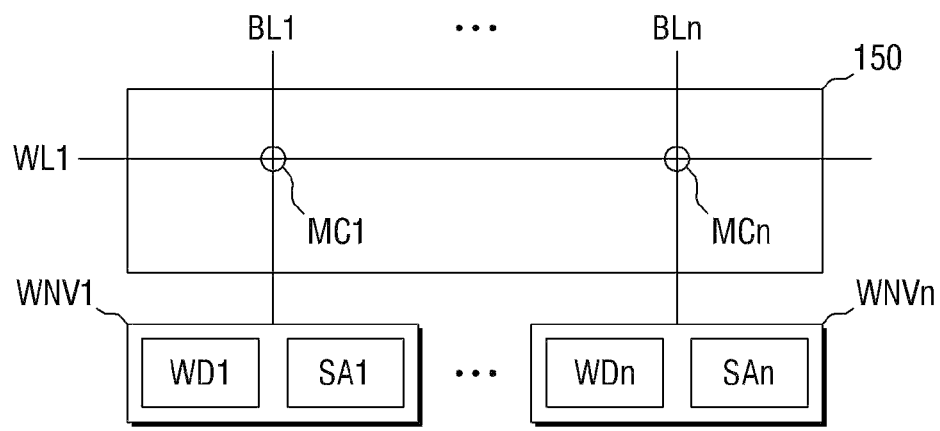
FIG. 4 is a block diagram illustrating the structure of a nonvolatile memory device and a method of driving the nonvolatile memory device according to an embodiment of the inventive concept.
Figure 5:
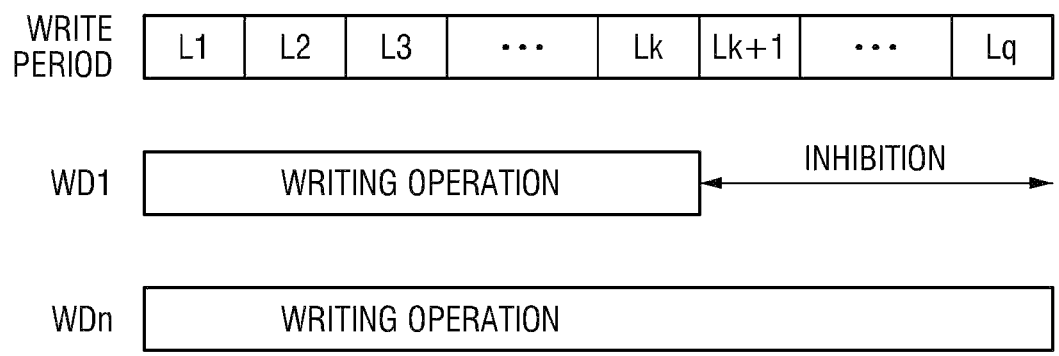
FIG. 5 is a diagram illustrating a method of driving a nonvolatile memory device according to an embodiment of the inventive concept.

FIG. 4 is a block diagram illustrating the structure of a nonvolatile memory device and a method of driving the nonvolatile memory device according to an embodiment of the inventive concept. FIG. 5 is a diagram illustrating a method of driving the nonvolatile memory device according to an embodiment of the inventive concept.

Referring to FIGS. 4 and 5, the nonvolatile memory device comprises a memory cell array 110 and a plurality of read/verify units WNV1 through WNVn (where n is a natural number).

Memory cell array 110 comprises a plurality of resistive memory cells MC1 through MCn. In FIG. 4, only resistive memory cells MC1 and MCn located in memory cell array 110 are illustrated for ease of description. Resistive memory cell MC1 is connected to a word line WL1 and a bit line BL1, and resistive memory cell MCn is connected to word line WL1 and a bit line BLn.

Write/verify units WNV1 through WNVn comprise write drivers WD1 through WDn and sense amps SA1 through SAn, respectively. Write drivers WD1 through WDn respectively write data to the corresponding resistive memory cells MC1 through MCn using a write period comprising a plurality of loops L1 through Lq (where q is a natural number greater than or equal to two). That is, write drivers WD1 through WDn change a write current in each of loops L1 through Lq and provide the changed write current to the resistive memory cells MC1 through MCn.

In each of loops L1 through Lq, sense amps SA1 through SAn verify whether the data was correctly written to the corresponding resistive memory cells MC1 through MCn. For example, where sense amp SA1 determines that the data was written correctly (i.e., the nonvolatile memory cell MC1 passed) in the $k^{th}$ loop Lk (where k is a natural number smaller than q) among loops L1 through Lq, write driver WD1 corresponding to sense amp SA1 is disabled from the $(k+1)^{th}$ loop Lk+1 to the end of the write period. Where write driver WD1 is disabled, it neither provides a write current to a corresponding resistive memory cell MC1 nor pre-charges bit line BL1 during a verify operation (i.e., bit line BL1 is grounded or floating). Meanwhile, where write driver WD1 is disabled, the other write driver WDn writes data to the corresponding resistive memory cell MCn until the write period (i.e., maximum loop Lq) ends. Where the data is not written correctly until the end of maximum loop Lq, it is determined that the resistive memory cell MCn has failed.

After data is written correctly in a certain loop (e.g., Lk), if write drivers WD1 through WDn are not disabled in the remaining loops (Lk+1 through Lq in the example of FIG. 5) that follow the loop, an error may occur as follows. That is, if passed resistive memory cells (successful resistive memory cells) MC1 through MCn are read again, they may be read as failed due to a read error. As a result, a write current may be provided again to the passed resistive memory cells MC1 through MCn. Then, resistance values of the resistive memory cells MC1 through MCn may deviate from target values. That is, the passed resistive memory cells MC1 through MCn may turn into failed resistive memory cells MC1 through MCn. In contrast, in the described embodiments, after data is correctly written in a certain loop (e.g., Lk), write drivers WD1 through WDn are disabled in the remaining loops (Lk+1 through Lq in the example of FIG. 5) that follow the loop. Therefore, a write current is not provided again to the passed resistive memory cells MC1 through MCn. Accordingly, the reliability of write/verify operations can be improved.

Figure 6:
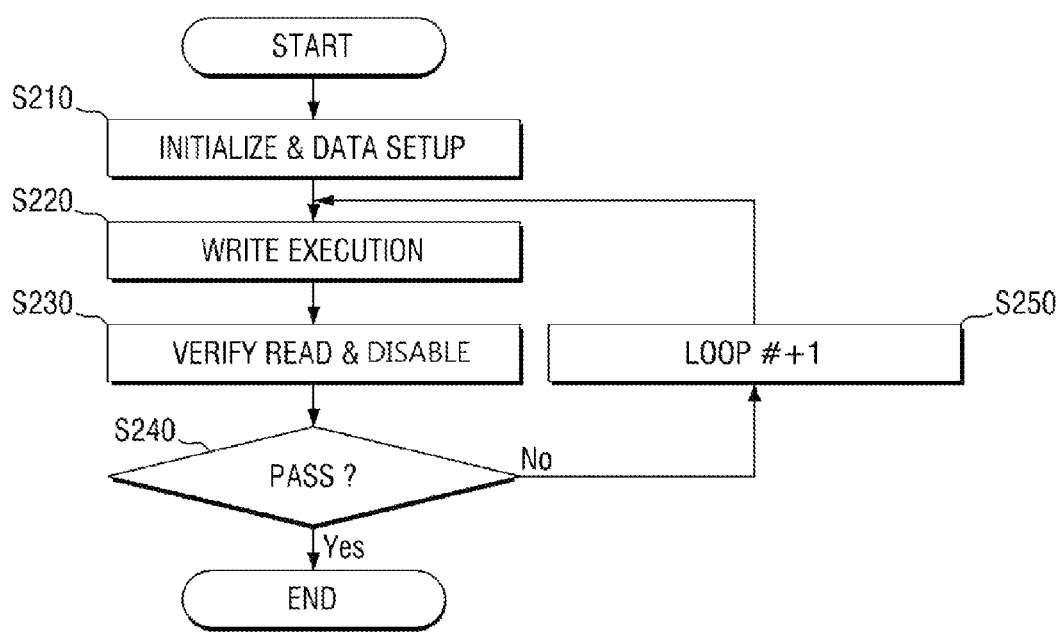
FIG. 6 is a flowchart illustrating a method of driving a nonvolatile memory device according to an embodiment of the inventive concept.

FIG. 6 is a flowchart illustrating a method of driving a nonvolatile memory device according to an embodiment of the inventive concept.

Referring to FIG. 6, initialization and data setup are executed (S210). For example, logical blocks (e.g., counters 130_1 through 130_b of FIG. 7 and an enable latch EL1 of FIG. 8) for a write operation are initialized.

Next, a write operation is executed (S220). After the write operation, a verify read operation is executed, and a disable operation is executed to disable write drivers based on the verification result (S230). Specifically, a write operation is executed using a write period that comprises first through $q^{th}$ loops L1 through Lq. A verify operation is executed in each of the first through $q^{th}$ loops L1 through Lq. For example, in the $k^{th}$ loop (1≤k≤q, where k is a natural number), data is written to resistive memory cells. A write current used in the write operation may have a different size in each loop. Next, it is verified whether the data was correctly written to the resistive memory cells. Depending on the verification result, no data may be written to the resistive memory cells during the (k+1)$^{th}$ through $q^{th}$ loops (i.e., until the write period ends).

Next, it is determined whether memory cells corresponding to all write drivers are passed the write operation, or have been successfully programmed (S240). If all of the memory cells have passed the write operation, the write operation ends. On the other hand, if any one of the memory cells failed in the write operation, the loop counter is incremented by one (S250). After the loop counter is incremented by one, the write operation (S220) and the verify read and disable operations (S230) are executed again.

Figure 7:
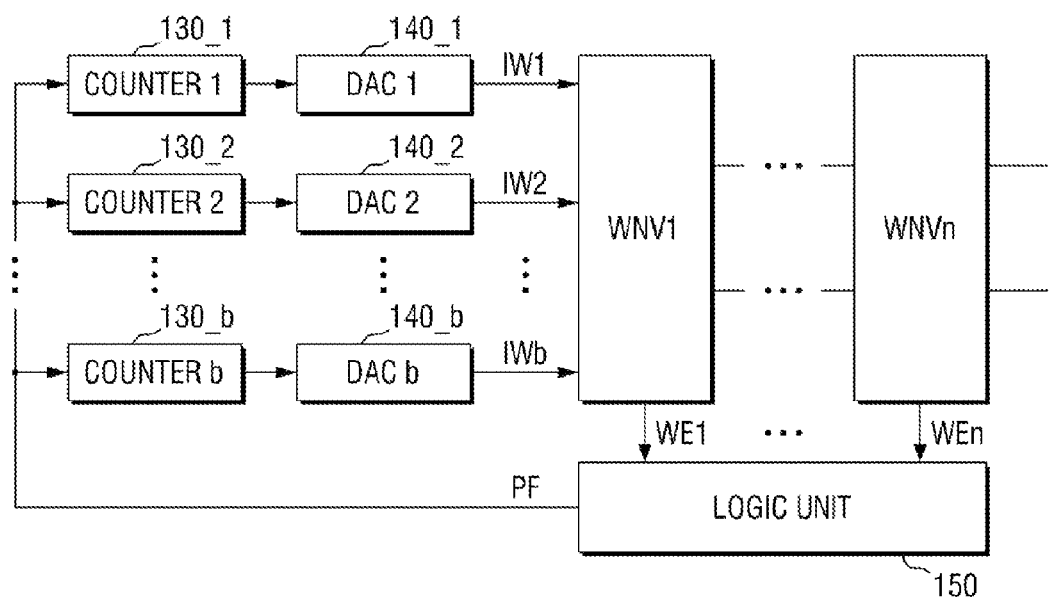
FIG. 7 is a block diagram of nonvolatile memory devices according to an embodiment of the inventive concept.
Figure 8:
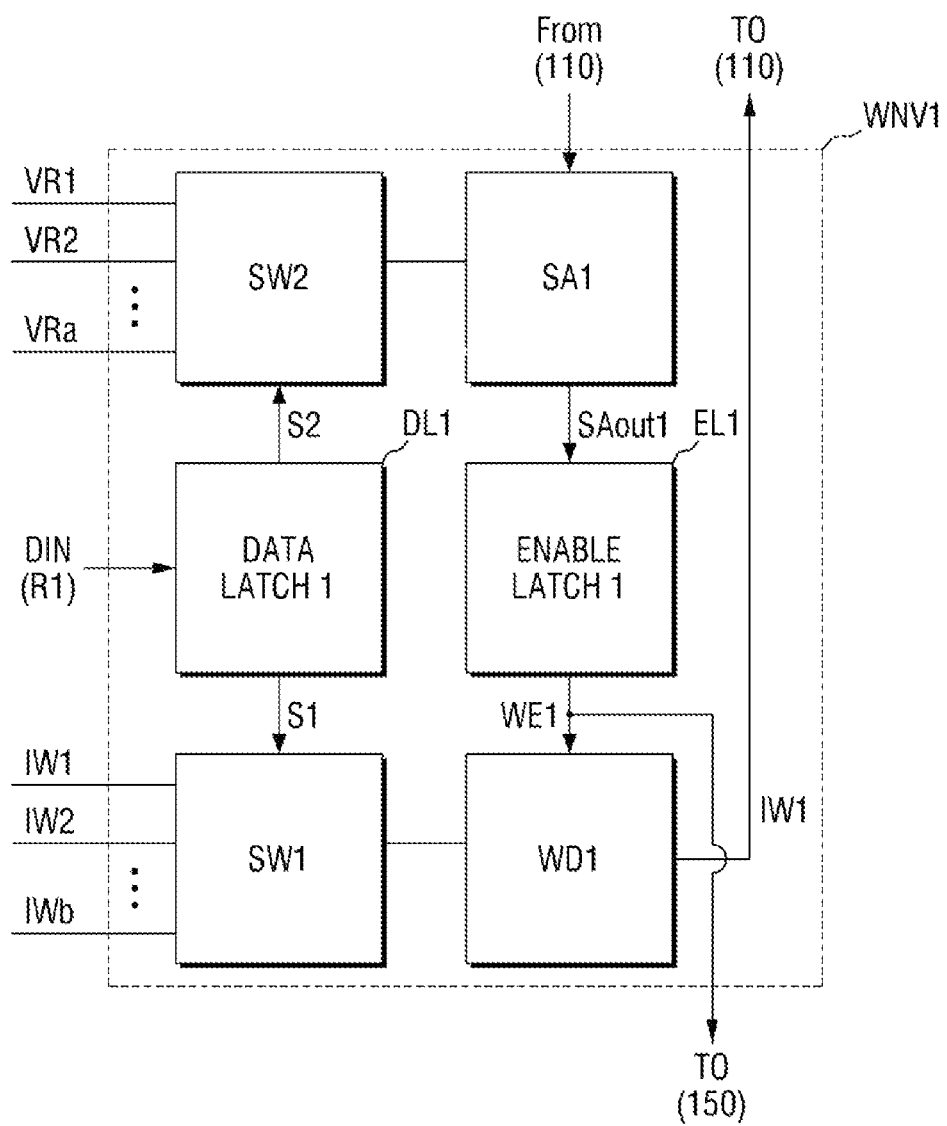
FIG. 8 is another block diagram of nonvolatile memory devices according to an embodiment of the inventive concept.

FIGS. 7 and 8 are block diagrams of a nonvolatile memory device according to an embodiment of the inventive concept. In particular, FIG. 7 is a diagram illustrating a plurality of write/verify units WNV1 through WNVn and circuit blocks related to write/verify units WNV1 through WNVn, and FIG. 8 is a detailed block diagram of a write/verify unit shown in FIG. 7.

Referring to FIG. 7, the nonvolatile memory device comprises write/verify units WNV1 through WNVn, a logic unit 150, a plurality of counters 130_1 through 130_b (where b is a natural number greater than or equal to two), and a plurality of digital-analog converters 140_1 through 140_b.

As described above, write/verify units WNV1 through WNVn write data to corresponding resistive memory cells using a write period comprising a plurality of loops, and they verify whether the data was correctly written to the resistive memory cells. Write/verify units WNV1 through WNVn also execute a disable operation based on the verification result.

Write/verify units WNV1 through WNVn output write enable signals WE1 through WEn, respectively. Where write enable signals WE1 through WEn are activated, write drivers in write/verify units WNV1 through WNVn operate.

Logic unit 150 receives write enable signals WE1 through WEn and outputs a pass/fail signal PF. Where any one of write enable signals WE1 through WEn is active, the pass/fail signal PF is activated. When all of write enable signals WE1 through WEn are inactive, the pass/fail signal PF is deactivated. Alternatively, in a maximum loop of the write period, the pass/fail signal PF is deactivated. For example, counter 130_1 and the digital-analog converter 140_1 are blocks that generate a write current IW1 for writing first data R1. Counter 130_2 and digital-analog converter 140_2 are blocks that generate a write current IW2 for writing second data R2. Similarly, counter 130_b and digital-analog converter 140_b are blocks that generate a write current IWb for writing $b^{th}$ data Rb (where b is a natural number greater than or equal to two).

Each of counters 130_1 through 130_b counts the number of loops in response to the pass/fail signal PF. Digital-analog converters 140_1 through 140_b decode outputs of counters 130_1 through 130_b and output write currents IW1 through IWb, respectively. Write/verify units WNV1 through WNVn select a necessary write current (e.g., IW1) from write currents IW1 through IWb and provide the selected write current to a memory cell array 110.

Referring to FIG. 8, a write/verify unit (e.g., WN1) comprises a write driver WD1, a sense amp SA1, an enable latch EL1, a data latch DL1, a first switch SW1, and a second switch SW2. Data latch DL1 stores data DIN to be written to a resistive memory cell. Data latch DL1 provides select signals S1 and S2, which correspond to data DIN to be written, to first switch SW1 and second switch SW2, respectively. Data latch DL1 may store first data R1, for example.

First switch SW1 is electrically connected to write driver WD1 and selects a write current to be provided to write driver WD1 from among write currents IW1 through IWb in response to select signal S1. Consequently, a write current corresponding to data DIN to be written is selected from write currents IW1 through IWb. For example, if data DIN to be written is first data R1, write current IW1 may be selected.

In addition, second switch SW2 is electrically connected to sense amp SA1 and selects a verify reference value to be provided to sense amp SA1 from among a plurality of verify reference values VR1 through VRa (where "a" is a natural number greater than or equal to two). For example, if data DIN to be written is first data R1, the verify reference value VR1 may be selected. Sense amp SA1 verifies whether data was correctly written using the selected verify reference value VR1 and outputs a verify signal SAout1 indicating the verification result.

Enable latch EL1 stores verify signal SAout1 and outputs write enable signal WE1 which corresponds to verify signal SAout1 to write driver WD1. When receiving verify signal SAout1 indicating a fail, enable latch EL1 activates write enable signal WE1 to enable write driver WD1. When receiving verify signal SAout1 indicating a pass, enable latch EL1 deactivates the write enable signal WE1 to disable write driver WD1. Because enable latch EL1 is a one-way latch, a stored value of enable latch EL1 remains unchanged from when verify signal SAout1 indicating a pass is received to the end of a write period. Therefore, write driver WD1 is disabled until the end of the write period (i.e., a maximum loop).

Figure 9:
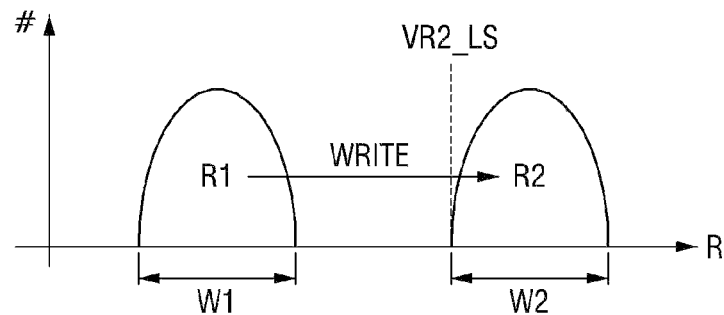
FIG. 9 is a diagram illustrating a method of operating a nonvolatile memory device according to an embodiment of the inventive concept.
Figure 10:
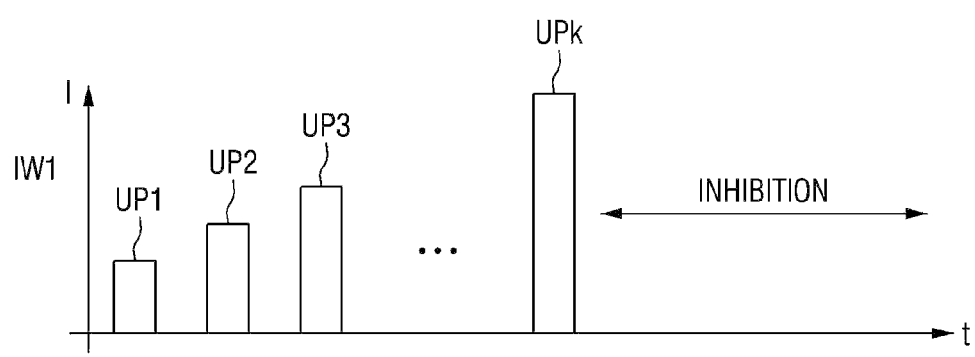
FIG. 10 is another diagram illustrating a method of operating a nonvolatile memory device according to an embodiment of the inventive concept.

FIGS. 9 and 10 are diagrams illustrating a method of operating a nonvolatile memory device according to a first embodiment of the inventive concept.

Referring to FIGS. 9 and 10, a resistive memory cell may store any one of first data R1 and second data R2. First data R1 and second data R2 correspond to a first resistance level W1 and a second resistance level W2, respectively. As shown in the drawings, second resistance level W2 is greater than first resistance level W1. Although not shown in the drawings, the resistive memory cell may be a multi-level cell.

A write driver (e.g., WD1) writes second data R2 to a resistive memory cell MC1 in which first data R1 is stored. Write driver WD1 executes a unidirectional write operation, i.e., it monotonically increases a write current IW1 provided in each of a plurality of loops L1 through Lk. As shown in the drawings, write current IW1 has a size of UP1 in first loop L1, a size of UP2 in second loop L2, and a size of UPk in $k^{th}$ loop Lk. Write current IW1 is increased by equal (as shown in the drawings) or different amounts in loops L1 through Lk.

A sense amp (e.g., SA1) executes a verify operation using one verify reference value VR2_LS. Where write driver WD1 provides write current IW1 with size of UPk to resistive memory cell MC1 in $k^{th}$ loop Lk, sense amp SA1 determines that the resistive memory cell MC1 is passed if a resistance value of the resistive memory cell MC1 is greater than verify reference value VR2_LS. Write driver WD1 is disabled until a write period ends (i.e., in remaining loops Lk+1 through Lq).

Figure 11:
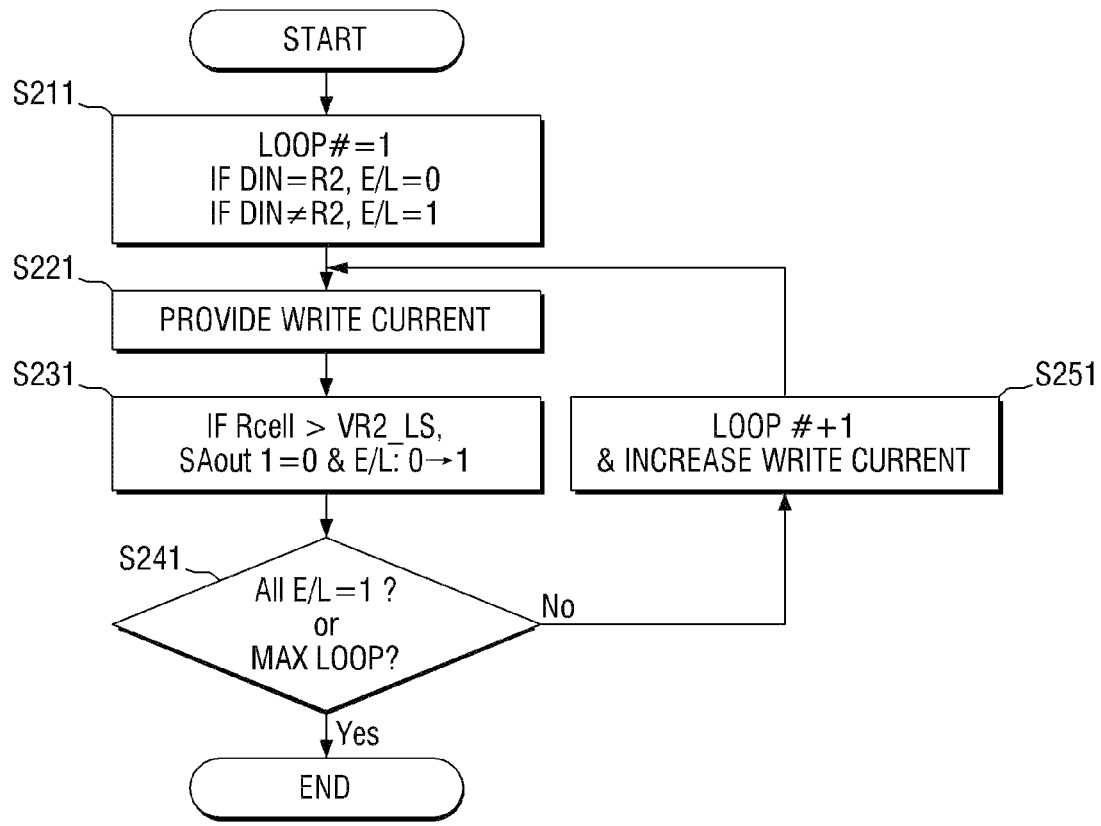
FIG. 11 is a flowchart illustrating an example of the method of FIGS. 9 and 10.

FIG. 11 is a flowchart illustrating an example of the method of FIGS. 9 and 10. This method will be described with reference to FIGS. 7, 8, and 11.

Referring to FIGS. 7, 8 and 11, initialization and data setup are executed (S211). That is, the number of loops of each of a plurality of counters 130_1 through 130_b is initialized to one. In addition, a data latch (e.g., DL1) and an enable latch (e.g., EL1) in each of a plurality of write/verify units WNV1 through WNVn are initialized according to data DIN to be written. For example, if data DIN stored in data latch DL1 is R1, the corresponding enable latch EL1 is set to zero. That is, an output signal (i.e., a write enable signal WE1) of enable latch EL1 is activated. If data DIN stored in data latch DL1 is not R2 (e.g., is R1), the corresponding enable latch EL1 is set to one. That is, the output signal (i.e., the write enable signal WE1) of enable latch EL1 is deactivated.

Next, a write operation is executed (S221). That is, write drivers WD1 through WDn which receive activated write enable signals WE1 through WEn provide a write current to resistive memory cells.

Then, it is verified whether data DIN was correctly written to the resistive memory cells (S231). For example, if a resistance value Rcell of a resistive memory cell is greater than a verify reference value VR2_LS, a verify signal SAout1 of a sense amp SA1 becomes zero. Enable latch EL1 receives verify signal SAout1 and transitions from zero to one. Therefore, write driver WD1 is disabled. If resistance value Rcell of the resistance memory cell is smaller than the verify reference value VR2_LS, verify signal SAout1 of sense amp SA1 is maintained at one, and the write enable signal WE1 provided by enable latch EL1 is maintained at zero.

Next, it is determined whether all enable latches transitioned to one and whether the write operation was executed until a maximum loop (S241). If all enable latches transitioned to one or if the write operation was executed until the maximum loop, the write operation is terminated. Otherwise, if not all enable latches transitioned to one and if the write operation was not executed until the maximum loop, a loop counter is incremented. In addition, the write current is increased (S251).

Figure 12:
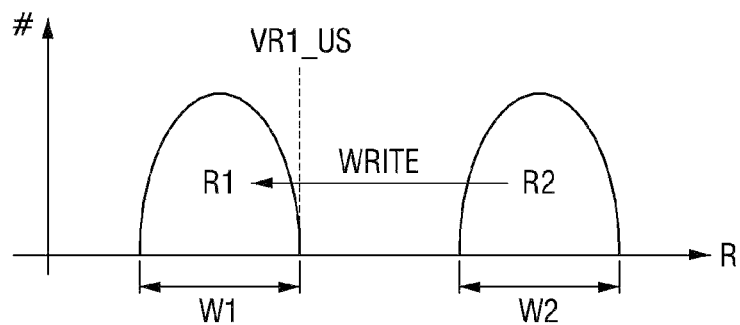
FIG. 12 is a diagram illustrating a method of operating a nonvolatile memory device according to an embodiment of the inventive concept.
Figure 13:
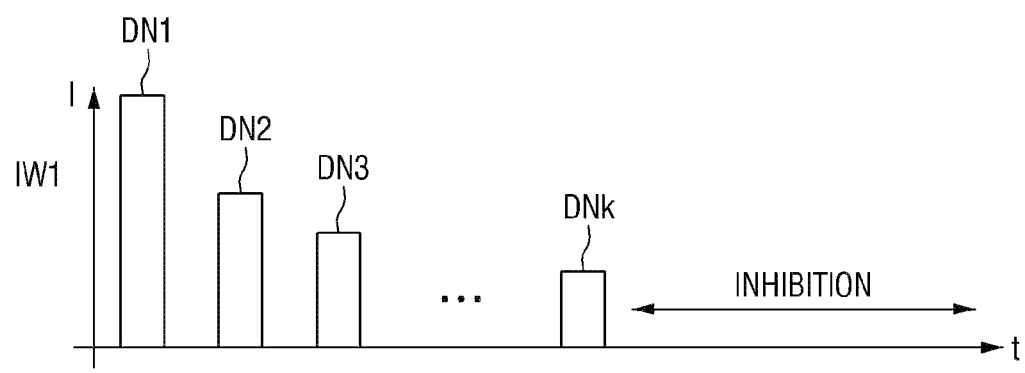
FIG. 13 is another diagram illustrating a method of operating a nonvolatile memory device according to an embodiment of the inventive concept.

FIGS. 12 and 13 are diagrams illustrating a method of operating a nonvolatile memory device according to another embodiment of the inventive concept.

Referring to FIGS. 12 and 13, a write driver (e.g., WD1) writes first data R1 to a resistive memory cell (e.g., MC1) in which second data R2 is stored. Here, write driver WD1 executes a unidirectional write operation. That is, write driver WD1 monotonically reduces a write current IW1 provided in each of a plurality of loops L1 through Lk. As shown in the drawings, write current IW1 has a size of DN1 in first loop L1, a size of DN2 in second loop L2, and a size of DNk in $k^{th}$ loop Lk. Write current IW1 is decreased by equal (as shown in the drawings) or different amounts in loops L1 through Lk.

Here, a sense amp (e.g., SA1) executes a verify operation using one verify reference value VR1_US. Where write driver WD1 provides write current IW1 to the resistive memory cell MC1 in $k^{th}$ loop Lk, sense amp SA1 may determine that the resistive memory cell MC1 has passed if a resistance value of the resistive memory cell MC1 is smaller than the verify reference value VR1_US. Write driver WD1 is disabled until a write period ends (i.e., in remaining loops Lk+1 through Lq).

Figure 14:
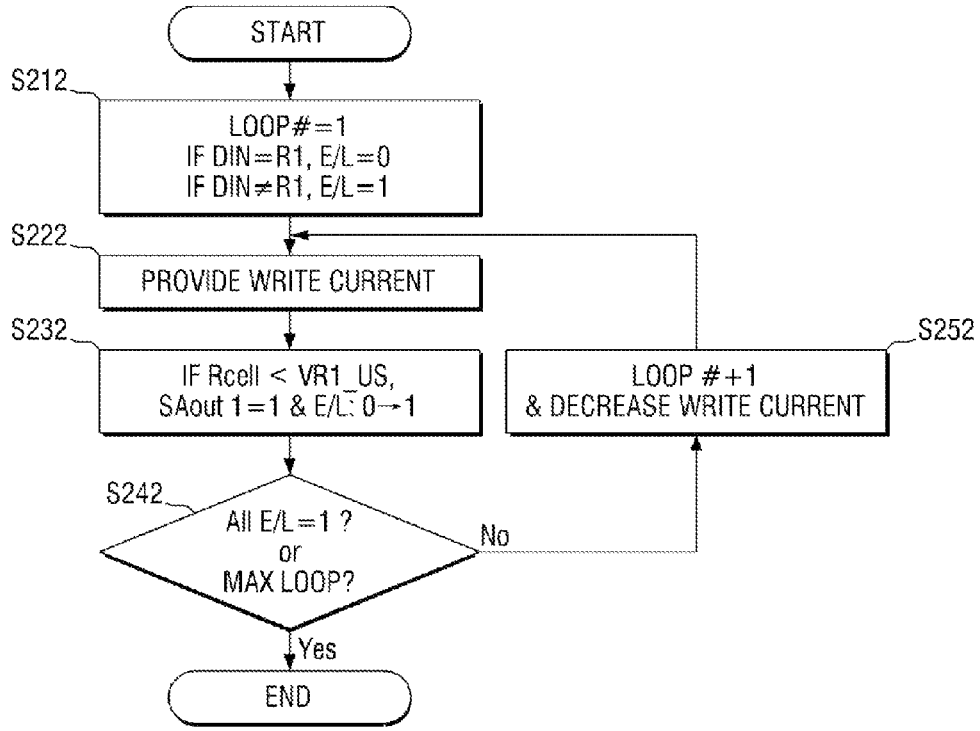
FIG. 14 is a flowchart illustrating an example of the method of FIGS. 12 and 13.

FIG. 14 is a flowchart illustrating an example implementation of the method of FIGS. 12 and 13. This implementation will be described with reference to FIGS. 7, 8 and 14.

Referring to FIGS. 7, 8 and 14, initialization and data setup are executed (S212). That is, the number of loops of each of a plurality of counters 130_1 through 130_b is initialized to one. In addition, a data latch (e.g., DL1) and an enable latch (e.g., EL1) in each of a plurality of write/verify units WNV1 through WNVn are initialized according to data DIN to be written. For example, if data DIN stored in data latch DL1 is R1, the corresponding enable latch EL1 is set to zero. That is, an output signal (i.e., a write enable signal WE1) of enable latch EL1 is activated. Conversely, if data DIN stored in data latch DL1 is not R1 (e.g., is R2), the corresponding enable latch EL1 is set to one. That is, the output signal (i.e., the write enable signal WE1) of enable latch EL1 is deactivated.

Next, a write operation is executed (S222). That is, write drivers WD1 through WDn receiving activated write enable signals WE1 through WEn provide a write current to resistive memory cells.

Then, it is verified whether data DIN was correctly written to the resistive memory cells (S232). For example, if a resistance value Rcell of a resistive memory cell is smaller than a verify reference value VR1_US, a verify signal SAout1 of a sense amp SA1 becomes one. Enable latch EL1 receives verify signal SAout1 and transitions from zero to one. Therefore, write driver WD1 is disabled. If resistance value Rcell of the resistance memory cell is greater than the verify reference value VR1_US, verify signal SAout1 of sense amp SA1 is maintained at one, and the write enable signal WE1 provided by enable latch EL1 is maintained at zero.

Next, it is determined whether all enable latches transitioned to one and whether the write operation was executed until a maximum loop (S242). If all enable latches transitioned to one or if the write operation was executed until the maximum loop, the write operation is terminated. Otherwise, if not all enable latches transitioned to one and if the write operation was not executed until the maximum loop, the loop counter is incremented. In addition, the write current is decreased (S252).

Figure 15:
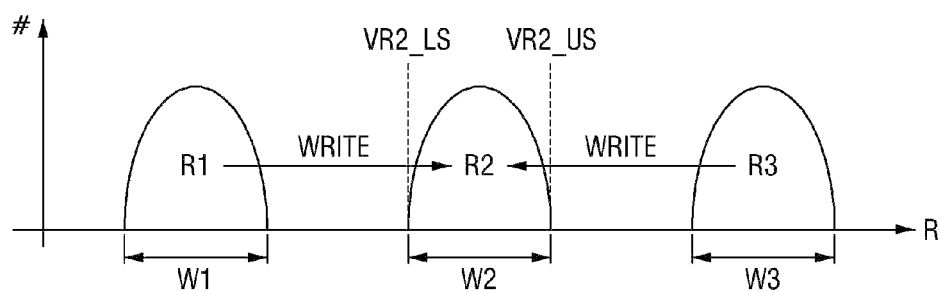
FIG. 15 is a diagram illustrating a method of operating a nonvolatile memory device according to still another embodiment of the inventive concept.

FIGS. 15 and 16 are diagrams illustrating a method of operating a nonvolatile memory device according to another embodiment of the inventive concept.

Referring to FIGS. 15 and 16, a write driver (e.g., WD1) writes second data R2 to a resistive memory cell (e.g., MC1). Here, write driver WD1 may execute a selective bidirectional write operation. In this case, a sense amp (e.g., SA1) executes a verify operation using two verify reference values VR2_LS and VR2_US. That is, a write method may be determined by the verification result of sense amp SA1.

If the resistance of the resistive memory cell MC1 is smaller than the verify reference value VR2_LS, a write current IW1 provided in each of a plurality of loops L1 through Lk may be increased continuously as in a first case ①. As shown in the drawings, write current IW1 may have a size of UP11 in first loop L1, a size of UP12 in second loop L2, and a size of UP1k in $k^{th}$ loop Lk. Write current IW1 may be increased by equal (as shown in the drawings) or different amounts in loops L1 through Lk.

On the other hand, if the resistance of the resistive memory cell MC1 is greater than the verify reference value VR2_US, write current IW1 provided in each of loops L1 through Lk may be decreased continuously as in a second case ②. As shown in the drawings, write current IW1 has a size of DN11 in first loop L1, a size of DN12 in second loop L2, and a size of DN1k in $k^{th}$ loop Lk. write current IW1 may be decreased by equal (as shown in the drawings) or different amounts in loops L1 through Lk.

In the first and second cases ① and ②, after data is written correctly in a certain loop (e.g., L1k), write driver WD1 is disabled in remaining loops L1k+1 through L1q that follow the loop. That is, a write current is not provided again to the passed resistance memory cell MC1.

Figure 17:
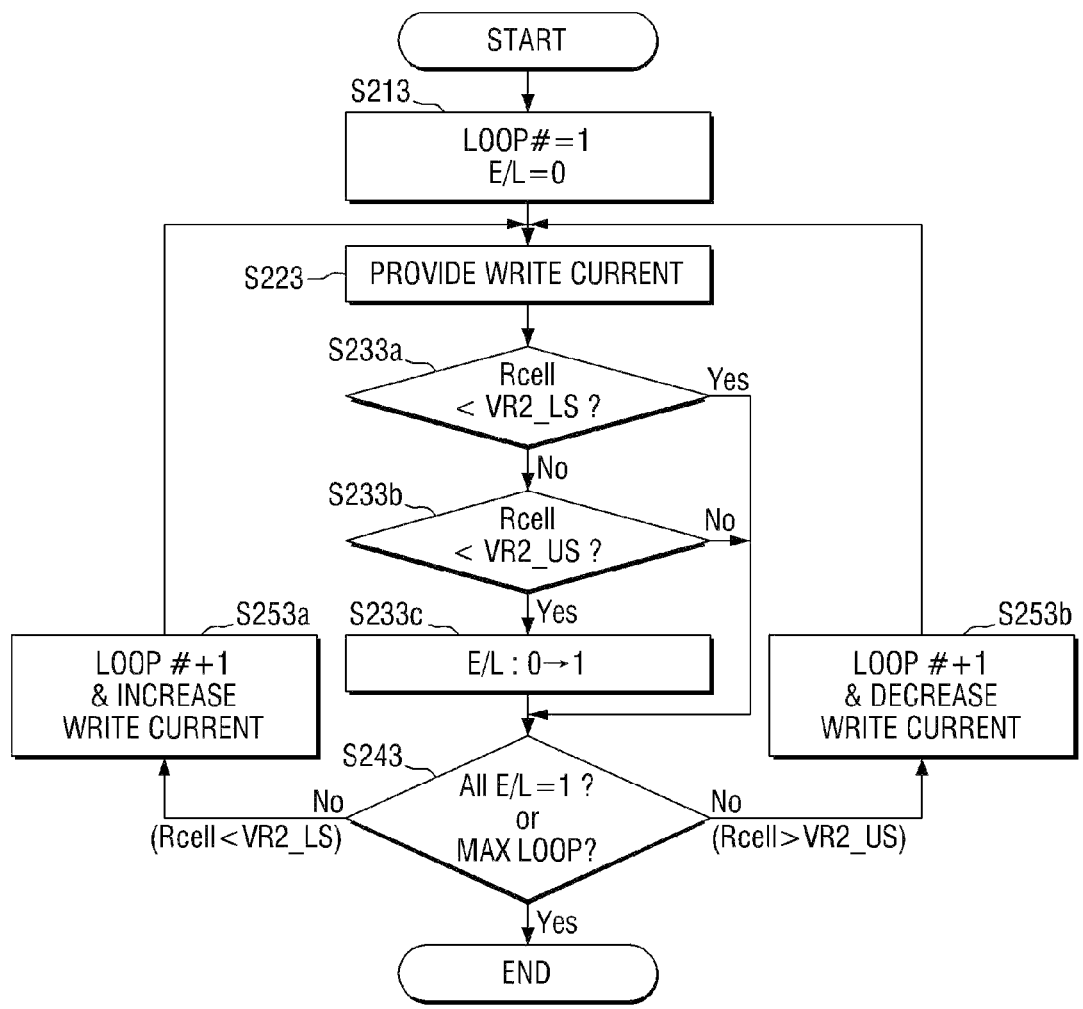
FIG. 17 is a flowchart illustrating an example of the method of FIGS. 15 and 16.

FIG. 17 is a flowchart illustrating an example of the method of FIGS. 15 and 16.

Referring to FIG. 17, the number of loops of each of a plurality of counters 130_1 through 130_b is initialized to one. Then, a write operation is executed by providing a write current (S223).

Next, it is verified whether data was correctly written to resistive memory cells using two verify reference values VR2_LS and VR2_US. Specifically, if a resistance value Rcell of a resistive memory cell is greater than the verify reference value VR2_LS (S233a) and is smaller than the verify reference value VR2_US (S233b), an enable latch (e.g., EL1) transitions from zero to one. On the other hand, if resistance value Rcell of the resistive memory cell is smaller than the verify reference value VR2_LS or greater than the verify reference value VR2_US, operation S243 is performed.

Next, it is determined whether all enable latches transitioned to one and whether the write operation was executed until a maximum loop (S243). If all enable latches transitioned to one or if the write operation was executed until the maximum loop, the write operation is terminated. Otherwise, if not all enable latches transitioned to one and if the write operation was not executed until the maximum loop, the loop counter is incremented. Here, if resistance value Rcell of a resistive memory cell is smaller than the verify reference value VR2_LS, the write current is increased (S253a). On the other hand, if resistance value Rcell of the resistive memory cell is greater than the verify reference value VR2_US, the write current is decreased (S253b).

Figure 18:
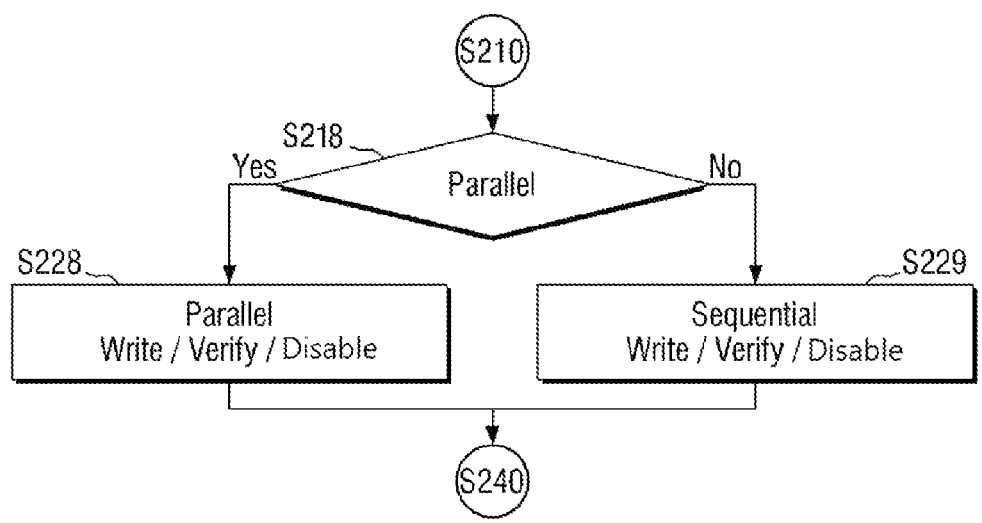
FIG. 18 is a flowchart illustrating a method of operating a nonvolatile memory device according to still another embodiment of the inventive concept.

FIG. 18 is a flowchart illustrating a method of operating a nonvolatile memory device according to another embodiment of the inventive concept. Some operations (write and verify operations) of FIG. 6 are additionally illustrated in FIG. 18.

Referring to FIG. 18, it is determined whether to execute a parallel write operation or a sequential write operation (S218). In the case of the parallel write operation, a plurality of write/verify units write/verify data in parallel. Then, the above-described disable operation is executed (S228). That is, while some write drivers write first data R1, other write drivers may write second data RF2.

In the case of the sequential write operation, the write/verify units operate sequentially. Then, the above-described disable operation is executed (S229). That is, after some write drivers write first data R1, other write drivers may write second data R2. Specifically, while a first write/verify unit WNV1 writes/verifies first data R1, a second sense amp SA2 of a second write/verify unit WNV2 is disabled. Conversely, while the second write/verify unit WNV2 writes/verifies second data R2, a first sense amp SA1 of the first write/verify unit WNV1 is disabled.

Where data is written in parallel to a plurality of resistive memory cells, a selective bidirectional write method may make fast and accurate write and verify operations possible. Where data is written sequentially to a plurality of resistive memory cells, the selective bidirectional write method may make it possible to collect distributions more accurately or improve write/verify capabilities by reducing the write time.

Figure 19:
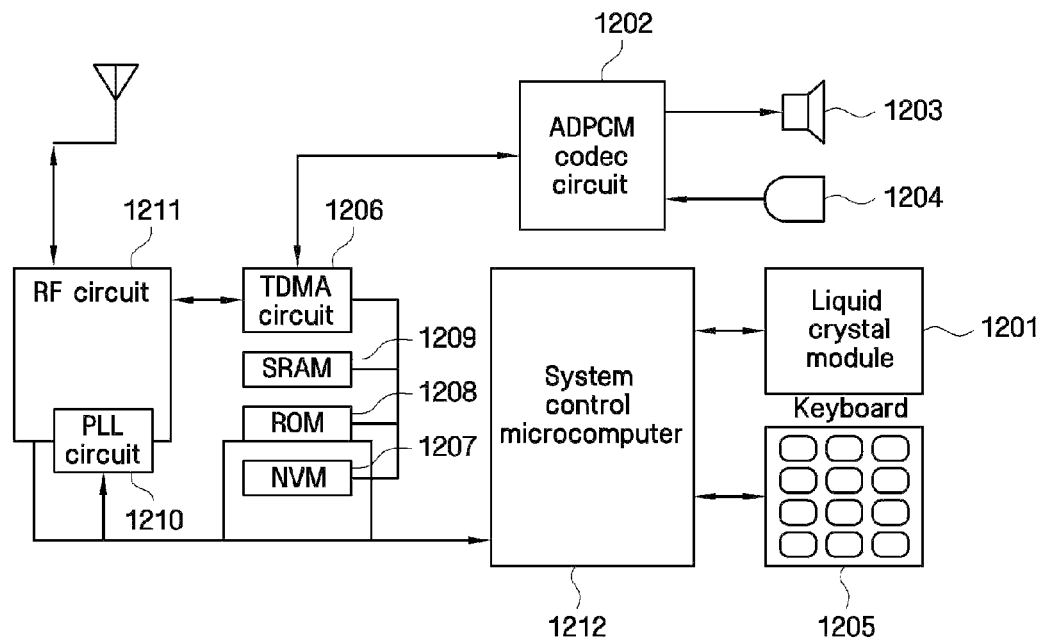
FIG. 19 is a diagram of a cellular phone system comprising a nonvolatile memory device according to an embodiment of the inventive concept.

FIG. 19 is a diagram of a cellular phone system comprising a nonvolatile memory device according to an embodiment of the inventive concept.

Referring to FIG. 19, the cellular phone system comprises a compression or decompression ADPCM codec circuit 1202, a speaker 1203, a microphone 1204, a TDMA circuit 1206 for time-division-multiplexing digital data, a PLL circuit 1210 setting a carrier frequency of a wireless signal, and an RF circuit 1211 for transferring or receiving the wireless signal.

Further, the cellular phone system may include various kinds of memory devices, and for example, may include a nonvolatile memory device 1207, a ROM 1208, and an SRAM 1209. Nonvolatile memory device 1207 may take the form of one of the embodiments described above, and may store, for example, ID numbers. ROM 1208 may store programs, and SRAM 1209 may serve as a workspace for a system control microcomputer 1212 or may temporarily store data. Here, system control microcomputer 1212 may be a processor that can control write and read operations of nonvolatile memory device 1207.

Figure 20:
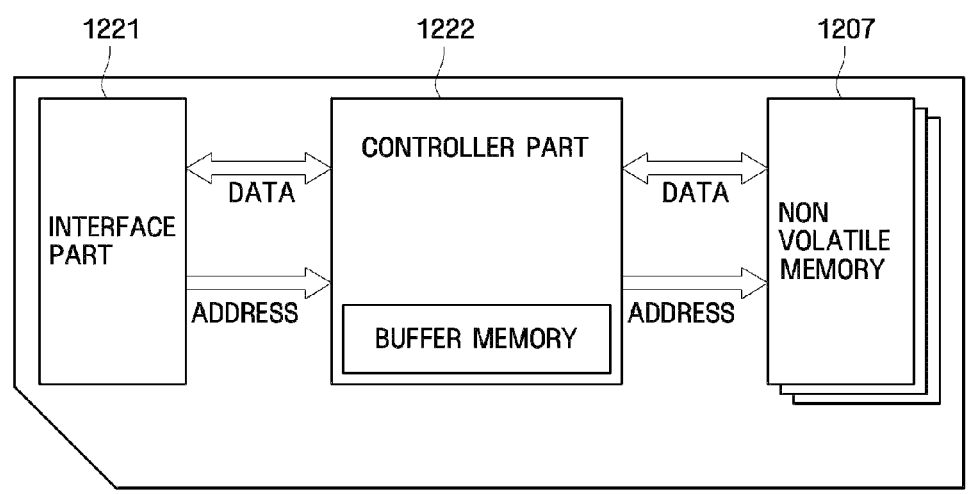
FIG. 20 is a diagram of a memory card comprising a nonvolatile memory device according to an embodiment of the inventive concept.

FIG. 20 is a diagram of a memory card comprising a nonvolatile memory device according to an embodiment of the inventive concept. The memory card may be, for example, an MMC card, an SD card, a multiuse card, a micro SD card, a memory stick, a compact SD card, an ID card, a PCMCIA card, a SSD card, a chip card, a smart card, or a USB card.

Referring to FIG. 20, the memory card may include at least one of an interface part 1221 performing an interface with an outside, a controller 1222 having a buffer memory and controlling the operation of the memory card, and a nonvolatile memory device as described above in connection with one or more embodiments. Controller 1222 is a processor that can control write and read operations of nonvolatile memory device 1207. Specifically, controller 1222 is coupled to nonvolatile memory device 1207 and interface part 1221 through a data bus DATA and an address bus ADDRESS.

Figure 21:
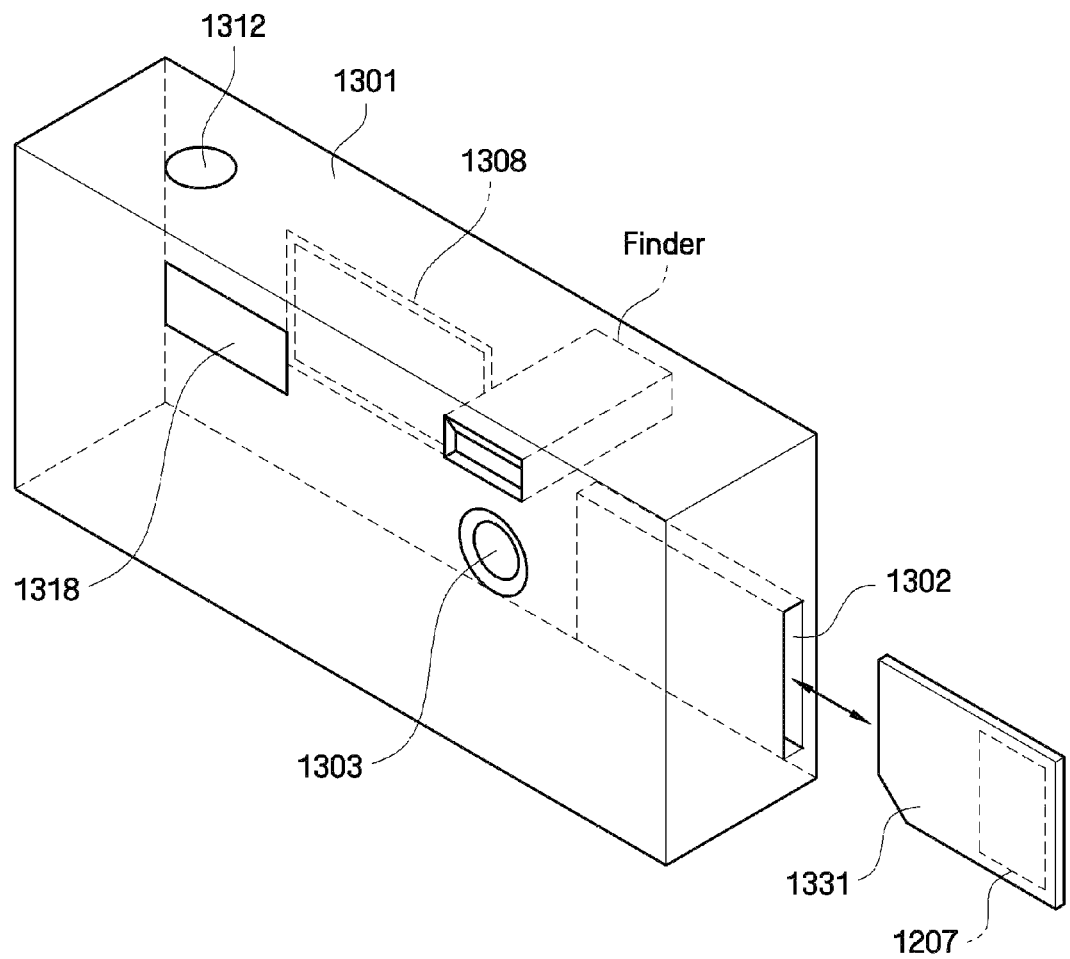
FIG. 21 is a diagram of a digital still camera comprising a nonvolatile memory device according to an embodiment of the inventive concept.

FIG. 21 is a view of a digital still camera comprising a nonvolatile memory device according to an embodiment of the inventive concept.

Referring to FIG. 21, the digital still camera comprises a body 1301, a slot 1302, a lens 303, a display unit 1308, a shutter button 1312, and a strobe 1318. In particular, a memory card 1331 may be inserted into slot 1308, and memory card 1331 may include at least one nonvolatile memory device 1207 according to an embodiment of the inventive concept.

Where memory card 1331 is of a contact type, memory card 1331 comes in electrical contact with a specific electrical circuit on a circuit board when memory card 1331 is inserted into slot 1308. Where memory card 1331 is of a non-contact type, memory card 1331 performs communications through a wireless signal.

Figure 22:
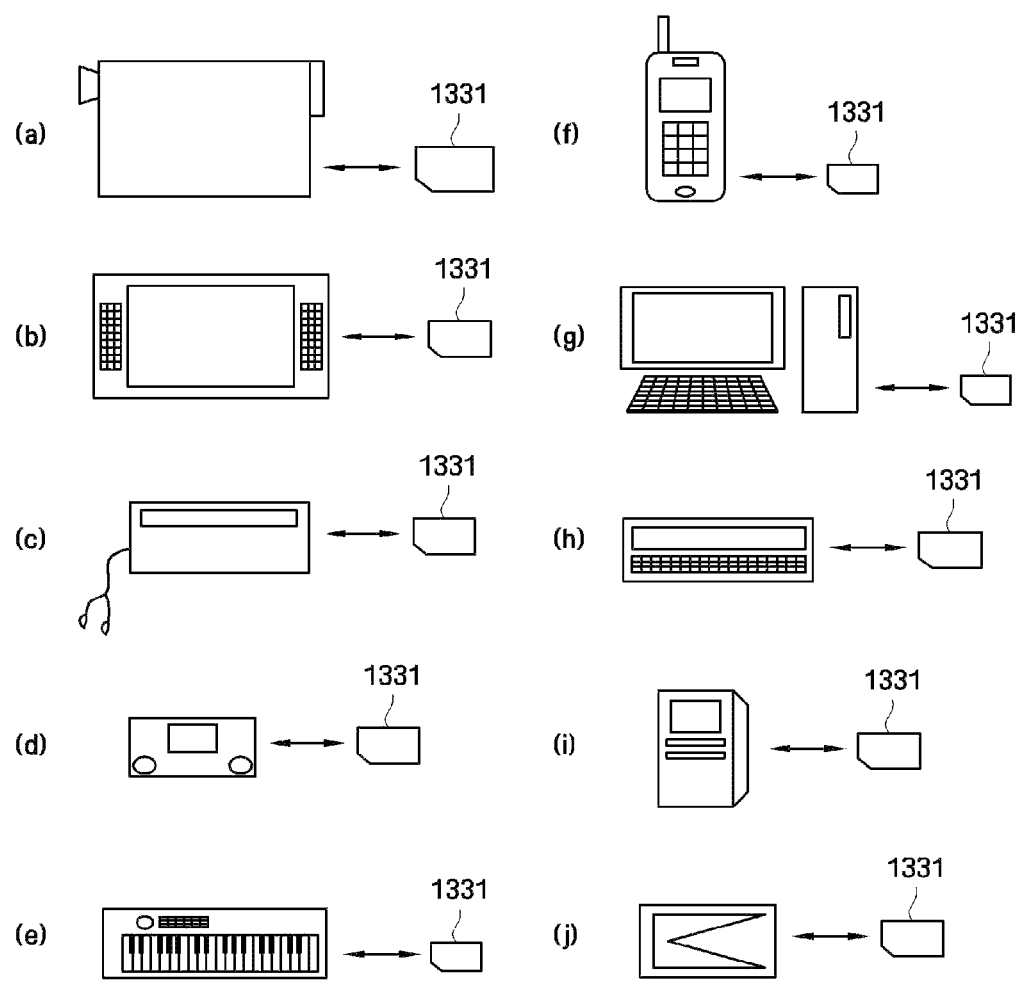
FIG. 22 is a diagram illustrating various systems configured to use the memory card of FIG. 20.

FIG. 22 is a view illustrating various systems using the memory card of FIG. 20.

Referring to FIG. 22, memory card 331 may be used in, for example, (a) a video camera, (b) a television receiver, (c) an audio device, (d) a game machine, (e) an electronic music device, (f) a cellular phone, (g) a computer, (h) a PDA (Personal Digital Assistant), (i) a voice recorder, or (j) a PC card.

Figure 23:
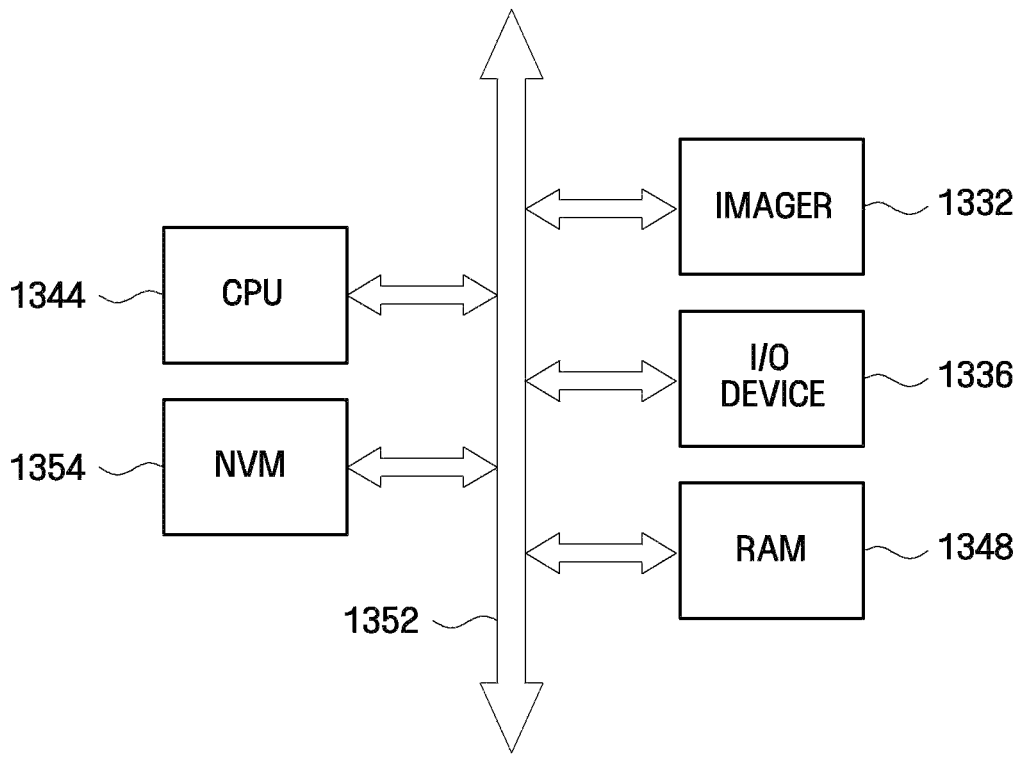
FIG. 23 is a diagram of an image sensor system comprising a nonvolatile memory device according to an embodiment of the inventive concept.

FIG. 23 is a diagram of an image sensor system using a nonvolatile memory device according to an embodiment of the inventive concept.

Referring to FIG. 23, an image sensor system comprises an image sensor 1332, an input/output device 1336, a RAM 1348, a CPU 1344, and a nonvolatile memory device 1354 corresponding to one of the embodiments described above. These features communicate with each other through a bus 1352. Image sensor 1332 typically comprises a photo sensing element, such as a photo gate and a photodiode. The respective features may be constructed into one chip together with a processor, or they may be constructed as a separate chip from the processor.

Figure 24:
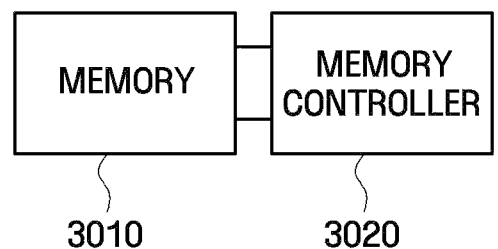
FIG. 24 is a block diagram of a memory system comprising a nonvolatile memory device according to an embodiment of the inventive concept.

FIG. 24 is a block diagram of a memory system comprising a nonvolatile memory device according to an embodiment of the inventive concept.

As illustrated, a memory 3010 is coupled to a memory controller 3020. Memory 3010 can implemented with one or more of the nonvolatile memory devices described above. Memory controller 3020 provides an input signal for controlling the operation of memory 3010. For example, memory controller 3020 may send a command and an address signal. Memory controller 3020 typically comprises a memory interface, a host interface, an ECC circuit, a CPU (Central Processing Unit), and a buffer memory. The memory interface may transmit data from the buffer memory to memory 3010, and may read the data from memory 3010 and transmit the data to the buffer memory. Further, the memory interface may transmit the command or the address from an external host to memory 3010.

The host interface may communicate with the external host by a standardized protocol such as, e.g., Universal Serial Bus (USB), Small Computer System Interface (SCSI), PCI express, an ATA, a Parallel ATA (PATA), a Serial ATA (SATA), or a Serial Attached SCSI (SAS).

The memory system may also have an ECC circuit configured to generate a parity bit using the data transmitted to memory 3010. The generated parity bit may be stored in a specific region of memory 3010 together with the data. The ECC circuit senses an error of the data that is read from memory 3010. If the sensed error is correctable, the ECC circuit corrects the data.

The CPU controls the external host or memory 3010 through the host interface or the memory interface. The CPU may control write, read, and erase operations in accordance with firmware.

The buffer memory temporarily stores write data provided from the external source or data read from memory 3010. Further, the buffer memory may store metadata or cache data to be stored in memory 3010. During a sudden power-off operation, the metadata or the cache data stored in the buffer memory may be stored in memory 3010. The buffer memory may be a DRAM or an SRAM.

Figure 25:
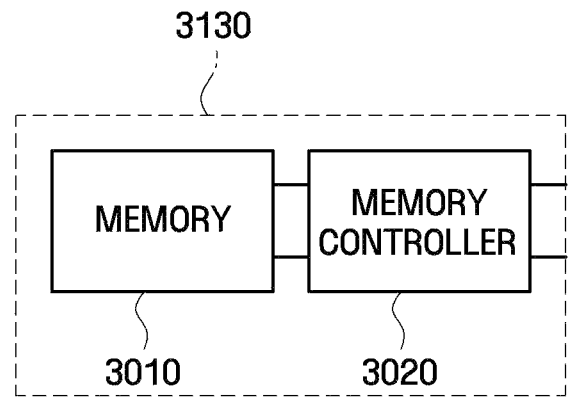
FIG. 25 is a block diagram of a memory system comprising a nonvolatile memory device according to another embodiment of the inventive concept.

FIG. 25 is block diagram of a memory system comprising a nonvolatile memory device according to still another embodiment of the inventive concept. The memory system of FIG. 25 is substantially the same as the memory system of FIG. 24, except that memory 3010 and memory controller 3020 are embedded in a card 3130. For example, card 3130 may be a flash memory card. That is, card 3130 may be standard product that is used in a consumer electronic appliance, such as a digital camera and a personal computer. Memory controller 3020 controls memory 3010 in accordance with a control signal provided from another device (external device).

Figure 26:
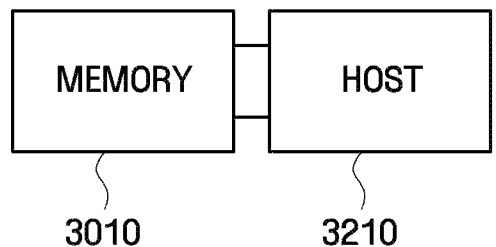
FIG. 26 is a block diagram of a memory system comprising a nonvolatile memory device according to still another embodiment of the inventive concept.

FIG. 26 is a block diagram of a memory system comprising a nonvolatile memory device according to still another embodiment of the inventive concept. As illustrated in FIG. 26, memory 3010 is coupled to a host system 3210. Host system 3210 uses memory 3010 as an erasable storage device. As described above, host system 3210 may provide an input signal for controlling memory 3010. For example, host system 3210 may provide a command CMD and an address signal.

Figure 27:
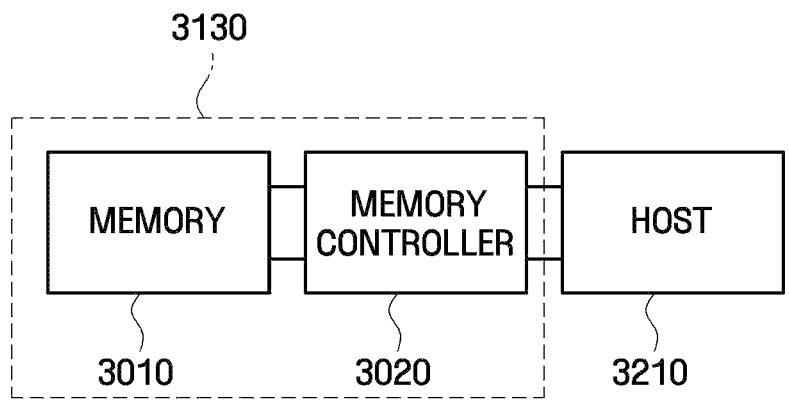
FIG. 27 is a block diagram of a memory system comprising a nonvolatile memory device according to still another embodiment of the inventive concept.

FIG. 27 is a block diagram of a memory system comprising a nonvolatile memory device according to still another embodiment of the inventive concept. In this embodiment, host system 3210 and card 3130 are coupled to each other. Host system 3210 provides a control signal to card 3130, and memory controller 3020 controls memory 3010.

Figure 28:
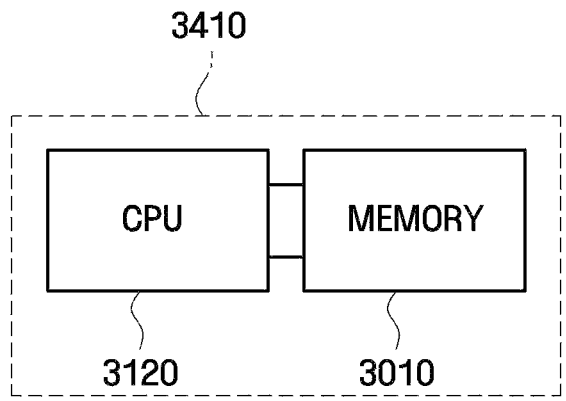
FIG. 28 is a block diagram of a memory system comprising a nonvolatile memory device according to still another embodiment of the inventive concept.

FIG. 28 is a block diagram of a memory system comprising a nonvolatile memory device according to still another embodiment of the inventive concept. In this embodiment, memory 3010 is provided in CPU 3120 of a computer system 3410. Computer system 3410 may be, for instance, a personal computer or a PDA. Memory 3010 can be directly connected to CPU 3120 through a bus.

A nonvolatile memory device using a resistance material, such as a PRAM, RRAM, or MRAM as described above, can be used as an SCM. The SCM may be used as a data storage memory in place of a flash memory, or it may be used as a main memory in place of an SRAM. Moreover, one SCM can substitute for both a flash memory and an SRAM.

Figure 29:
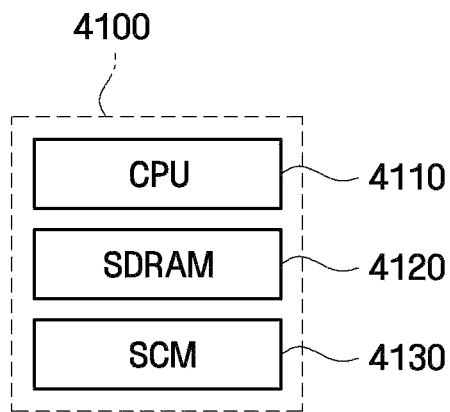
FIG. 29 is a block diagram illustrating a memory system comprising storage class memory (SCM) according to an embodiment of the inventive concept.

FIG. 29 is a block diagram illustrating a memory system 4100 comprising SCM. Memory system 4100 comprises a CPU 4110, an SDRAM 4120, and an SCM 4130 used in place of a flash memory.

In memory system 4100, data access speed of SCM 4130 is higher than the speed of the flash memory. For example, in a PC environment, when CPU 4110 operates at 4 GHz, the access speed of the PRAM that is a kind of SCM is 32 times higher than the access speed of the flash memory. Accordingly, memory system 4100 can obtain a higher-speed access gain than the memory system mounted with the flash memory.

Figure 30:
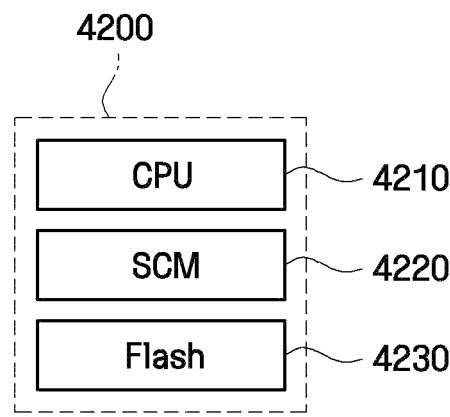
FIG. 30 is a block diagram illustrating a memory system comprising SCM according to another embodiment of the inventive concept.

FIG. 30 is a block diagram illustrating a memory system 4200 comprising SCM. Memory system 4200 comprises a CPU 4210, an SCM 4220 used in place of an SDRAM, and a flash memory 4230.

In memory system 4200, SCM 4220 uses less power than the SDRAM. Energy used by a main memory of a computer system is about 40% of energy used by the whole system. The SCM can reduce, on an average, about 53% of dynamic energy use, and can reduce, on an average, about 73% of energy use due to leakage power. As a result, memory system 4200 can reduce energy compared with a memory system comprising SDRAM.

Figure 31:
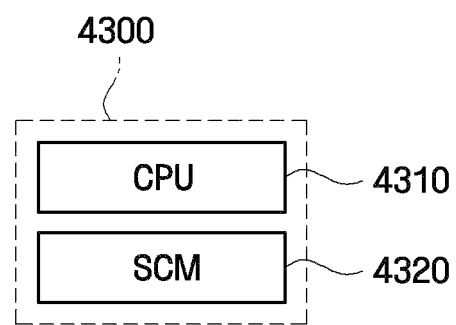
FIG. 31 is a block diagram illustrating a memory system comprising SCM according to still another embodiment of the inventive concept.

FIG. 31 is a block diagram illustrating a memory system 4300 comprising SCM. Memory system 4300 comprises a CPU 4310 and an SCM 4320 used in place of an SDRAM and a flash memory. SCM 4320 is used as a main memory in place of the SDRAM, and is used as a data storage memory in place of the flash memory. Memory system 4300 may provide potential benefits in data access speed, low power, space utilization, and cost.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device comprising:
   a resistive memory cell;
   a write driver configured to write data to the resistive memory cell during a write period comprising a plurality of loops; and
   a sense amplifier configured to verify whether the data is correctly written to the resistive memory cell in each of the loops,
   wherein, where the sense amplifier verifies that the data is correctly written in a k-th loop among the loops, the write driver is disabled from a (k+1)-th loop to an end of the write period.

2. The nonvolatile memory device of claim 1, wherein the sense amplifier generates a verify signal indicating a result of the verification, and further comprising an enable latch configured to store the verify signal and output a write enable signal corresponding to the verify signal to the write driver.

3. The nonvolatile memory device of claim 2, wherein the enable latch is a one-way latch having a stored value that remains unchanged from when the verifying signal indicating a pass is received to the end of the write period.

4. The nonvolatile memory device of claim 1, further comprising a data latch storing the data to be written to the resistive memory cell and providing a select signal that corresponds to the data.

5. The nonvolatile memory device of claim 4, further comprising a first switch electrically connected to the write driver and configured to select a write current to be provided to the write driver in response to the select signal.

6. The nonvolatile memory device of claim 4, further comprising a second switch electrically connected to the sense amplifier and configured to select a verify reference value to be provided to the sense amplifier in response to the select signal.

7. The nonvolatile memory device of claim 1, wherein the sense amplifier verifies whether the data is correctly written to the resistive memory cell using one verify reference value, and the write driver increases a write current provided in each of the loops.

8. The nonvolatile memory device of claim 1, wherein the sense amplifier verifies whether the data is correctly written to the resistive memory cell using one verify reference value, and the write driver decreases a write current provided in each of the loops.

9. The nonvolatile memory device of claim 1, wherein the sense amplifier verifies whether the data is correctly written to the resistive memory cell using two verify reference values, and the write driver increases or decreases a write current provided in each of the loops based on a result of the verification.

10. A nonvolatile memory device comprising:
first through n-th resistive memory cells; and
first through n-th write/verify units corresponding to the first through n-th resistive memory cells, respectively,
wherein an m-th write/verify unit (1≤m≤n) comprises an m-th write driver, an m-th sense amplifier and an m-th enable latch, wherein the m-th write driver executes a write operation during a write period in response to a corresponding write enable signal, the m-th sense amplifier verifies whether the write operation was executed correctly, and the m-th enable latch provides the corresponding write enable signal, wherein where the m-th sense amplifier determines that the write operation is executed correctly, the m-th enable latch disables the m-th write driver until the write period ends by transitioning the corresponding write enable signal.

11. The nonvolatile memory device of claim 10, wherein after all of first through n-th enable latches transition corresponding write enable signals, the write period is terminated.

12. The nonvolatile memory device of claim 10, wherein the write period comprises a plurality of loops and ends when all of the loops are completed.

13. The nonvolatile memory device of claim 10, wherein the first write/verify unit writes first data to the first resistive memory cell, and the second write/verify unit writes second data, which is different from the first data, to the second resistive memory cell, which is different from the first resistive memory cell.

14. The nonvolatile memory device of claim 13, wherein the first data and the second data are written sequentially, and a second sense amplifier of the second write/verify unit is disabled while the first write/verify unit writes/verifies the first data.

15. The nonvolatile memory device of claim 13, wherein the first data and the second data are written in parallel.

16. A method of operating a nonvolatile memory device comprising a resistive memory cell, a write driver, and a sense amplifier, the method comprising:
operating the write driver to write data to the resistive memory cell during a write period comprising a plurality of loops;
operating the sense amplifier to verify whether the data is correctly written to the resistive memory cell in each of the loops; and
upon verifying that the data is correctly written in a k-th loop among the loops, disabling the write driver from a (k+1)-th loop to an end of the write period.

17. The method of claim 16, further comprising the sense amplifier to generate a verify signal indicating a result of the verification, and further operating an enable latch to store the verify signal and output a write enable signal corresponding to the verify signal to the write driver.

18. The method of claim 17, wherein the enable latch is a one-way latch having a stored value that remains unchanged from when the verifying signal indicating a pass is received to the end of the write period.

19. The method of claim 16, wherein the sense amplifier verifies whether the data is correctly written to the resistive memory cell using one verify reference value, and the write driver monotonically increases or decreases a write current provided in each of the loops.

20. The method of claim 16, wherein the sense amplifier verifies whether the data is correctly written to the resistive memory cell using two verify reference values, and the write driver increases or decreases a write current provided in each of the loops based on a result of the verification.

* * * * *